United States Patent
Kim et al.

(10) Patent No.: US 12,250,858 B2
(45) Date of Patent: Mar. 11, 2025

(54) DISPLAY APPARATUS

(71) Applicant: SAMSUNG DISPLAY CO., LTD., Yongin-si (KR)

(72) Inventors: Yangwan Kim, Yongin-si (KR); Sunja Kwon, Yongin-si (KR); Byungsun Kim, Yongin-si (KR); Hyunae Park, Yongin-si (KR); Sujin Lee, Yongin-si (KR); Jaeyong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/483,432

(22) Filed: Oct. 9, 2023

(65) Prior Publication Data

US 2024/0040873 A1    Feb. 1, 2024

Related U.S. Application Data

(63) Continuation of application No. 17/694,393, filed on Mar. 14, 2022, now Pat. No. 11,785,816, which is a (Continued)

(30) Foreign Application Priority Data

Mar. 2, 2016    (KR) .................. 10-2016-0024880

(51) Int. Cl.
*H10K 59/131*    (2023.01)
*G02F 1/1333*    (2006.01)
(Continued)

(52) U.S. Cl.
CPC ......... *H10K 59/131* (2023.02); *G09G 3/3291* (2013.01); *H01L 27/1218* (2013.01);
(Continued)

(58) Field of Classification Search
CPC .... H10K 59/131; H10K 50/80; H10K 50/805; H10K 77/111; H10K 2102/311;
(Continued)

(56) References Cited

U.S. PATENT DOCUMENTS 9,276,055 B1    3/2016 Son et al.
9,564,477 B2    2/2017 Kim
(Continued)

FOREIGN PATENT DOCUMENTS

CN    104241295 A    12/2014
CN    104752485 A    7/2015
(Continued)

OTHER PUBLICATIONS

EPO Extended Search Report dated Jul. 11, 2017, for corresponding European Patent Application No. 17158551.6 (9 pages).
(Continued)

*Primary Examiner* — Sonya McCall-Shepard
(74) *Attorney, Agent, or Firm* — Womble Bond Dickinson (US) LLP

(57) ABSTRACT

A display apparatus includes a substrate having a bending region between a first region and a second region, the bending region being configured to be bent about a bending axis that extends in one direction; a display unit on the substrate; a first wiring unit at the bending region, the first wiring unit including a first bending portion having a plurality of first holes; and a second wiring unit spaced apart from the first wiring unit and at the bending region, the second wiring unit including a second bending portion having a different shape from the first bending portion.

19 Claims, 10 Drawing Sheets

Related U.S. Application Data continuation of application No. 16/858,426, filed on Apr. 24, 2020, now Pat. No. 11,276,744, which is a continuation of application No. 16/105,944, filed on Aug. 20, 2018, now Pat. No. 10,636,861, which is a continuation of application No. 15/411,810, filed on Jan. 20, 2017, now Pat. No. 10,056,446.

(51) Int. Cl.

| | | |
|---|---|---|
| *G02F 1/1345* | (2006.01) | |
| *G09F 9/30* | (2006.01) | |
| *G09F 9/33* | (2006.01) | |
| *G09G 3/3291* | (2016.01) | |
| *H01L 27/12* | (2006.01) | |
| *H10K 50/80* | (2023.01) | |
| *H10K 50/805* | (2023.01) | |
| *H10K 59/121* | (2023.01) | |
| *H10K 77/10* | (2023.01) | |
| *H10K 59/12* | (2023.01) | |
| *H10K 102/00* | (2023.01) | |

(52) U.S. Cl.
CPC .......... *H01L 27/124* (2013.01); *H10K 50/80* (2023.02); *H10K 50/805* (2023.02); *H10K 77/111* (2023.02); *G09G 2300/0426* (2013.01); *G09G 2380/02* (2013.01); *H10K 59/1201* (2023.02); *H10K 2102/311* (2023.02)

(58) Field of Classification Search
CPC ......... G09G 3/3291; G09G 2300/0426; G09G 2380/02; H01L 27/124; H01L 27/1218; G02F 1/13452; G02F 1/133305; G09F 9/301
See application file for complete search history.

(56) References Cited

U.S. PATENT DOCUMENTS

| | | |
|---|---|---|
| 9,600,112 B2 | 3/2017 | Zhang et al. |
| 2003/0034497 A1 | 2/2003 | Yamazaki et al. |
| 2008/0137016 A1 | 6/2008 | Kim et al. |
| 2014/0177182 A1 | 6/2014 | Cho |
| 2014/0217373 A1 | 8/2014 | Youn et al. |
| 2014/0217397 A1 | 8/2014 | Kwak et al. |
| 2015/0179728 A1 | 6/2015 | Kwon et al. |
| 2015/0187279 A1 | 7/2015 | Lee et al. |
| 2015/0357395 A1 | 12/2015 | Cheon et al. |
| 2016/0035812 A1 | 2/2016 | Kwon et al. |
| 2016/0064466 A1 | 3/2016 | Son et al. |
| 2016/0093685 A1 | 3/2016 | Kwon et al. |
| 2016/0172427 A1 | 6/2016 | Lee et al. |
| 2016/0190216 A1 | 6/2016 | Yang et al. |
| 2017/0077211 A1 | 3/2017 | Yamazaki et al. |
| 2017/0250242 A1 | 8/2017 | Ohara |
| 2017/0301266 A1 | 10/2017 | Zhang et al. |

FOREIGN PATENT DOCUMENTS

| | | |
|---|---|---|
| JP | 2004-119871 A | 4/2004 |
| KR | 10-2006-0043889 A | 5/2006 |
| KR | 10-2014-0064156 | 5/2014 |
| KR | 10-2014-0081419 | 7/2014 |
| KR | 10-2014-0087499 A | 7/2014 |
| KR | 10-2014-0099139 A | 8/2014 |
| KR | 10-2015-0079206 A | 7/2015 |
| KR | 10-2015-0142157 A | 12/2015 |
| KR | 10-2016-0019885 | 2/2016 |

OTHER PUBLICATIONS

Extended European Search Report issued for EP Patent Application No. 23188854.6 on Oct. 25, 2023, 9 pages.

DISPLAY APPARATUS

CROSS-REFERENCE TO RELATED PATENT APPLICATIONS

This application is a continuation of U.S. patent application Ser. No. 17/694,393, filed Mar. 14, 2022, which is a continuation of U.S. patent application Ser. No. 16/858,426, filed Apr. 24, 2020, now U.S. Pat. No. 11,276,744, which is a continuation of U.S. patent application Ser. No. 16/105,944, filed Aug. 20, 2018, now U.S. Pat. No. 10,636,861, which is a continuation of U.S. patent application Ser. No. 15/411,810, filed Jan. 20, 2017, now U.S. Pat. No. 10,056,446, which claims priority to and the benefit of Korean Patent Application No. 10-2016-0024880, filed Mar. 2, 2016, the entire content of all of which is incorporated herein by reference.

BACKGROUND

1. Field

One or more embodiments relate to display apparatuses.

2. Description of the Related Art

In general, a display apparatus includes a display unit on a substrate. Such a display apparatus may be bent at least partially so as to improve visibility from various angles or reduce an area of a non-display region.

However, according to related art, defects may occur while manufacturing a display apparatus that is bent, or the lifespan of the display apparatus may be reduced.

SUMMARY

One or more embodiments include a display apparatus capable of reducing or minimizing defect occurrences, such as a disconnection, during manufacturing of the display apparatus while securing a long lifespan of the display apparatus. However, the one or more embodiments are only examples, and the scope of the present invention is not limited thereto.

Additional aspects will be set forth in part in the description which follows and, in part, will be apparent from the description, or may be learned by practice of the presented embodiments.

According to one or more embodiments, a display apparatus includes a substrate having a bending region between a first region and a second region, the bending region being configured to be bent about a bending axis that extends in one direction; a display unit on the substrate; a first wiring unit at the bending region, the first wiring unit including a first bending portion having a plurality of first holes; and a second wiring unit spaced apart from the first wiring unit and at the bending region, the second wiring unit including a second bending portion having a different shape from the first bending portion.

The second wiring unit may include a second bending portion having a plurality of second holes.

A planar shape of each of the plurality of first holes may be different from a planar shape of each of the plurality of second holes.

The number of first holes may be different from the number of second holes.

A planar shape of each of the plurality of second holes may be a polygon, a circle, an oval, a portion of a polygon, a portion of a circle, or a portion of an oval.

The planar shape of each of the plurality of second holes may be a fan shape including two straight lines of which respective one ends contact each other at a certain angle and a curved portion connecting other respective ends of the two straight lines to each other.

The plurality of second holes may include a (2-1)th hole having a first curved portion protruding in a first direction and a (2-2)th hole having a second curved portion protruding in a second direction opposite to the first direction, the (2-1)th hole may alternate with the (2-2)th hole in a third direction crossing with the first direction or the second direction.

The display apparatus may further include an insulating layer that covers the first wiring unit and the second wiring unit.

A portion of the insulating layer may be at the plurality of first holes and the plurality of second holes.

Second holes on an n-th row among the plurality of second holes may be apart by a first distance from second holes on an (n−1)th row among the plurality of second holes in a first direction, and a planar shape of each of the plurality of second holes may be a curve.

The first distance may be less than a width of a second hole on the (n−1)th row.

An outline of each of the plurality of second holes may include a first curved portion and a second curved portion that is symmetrical to the first curved portion.

Each of the first curved portion and the second curved portion may include a section rounded clockwise by using an arbitrary reference point on a second axis following a second direction perpendicular to the first direction as a starting point, and a section rounded counterclockwise from the arbitrary reference point as the starting point.

The first curved portion may include a first section rounded clockwise to have a first curvature from the second axis; a second section rounded counterclockwise to have a second curvature from the first section; and a third section rounded clockwise to have a third curvature from the second section.

When an identical current is applied to the first wiring unit and the second wiring unit, the first wiring unit may have a first resistance value and the second wiring unit may have a second resistance value that is less than the first resistance value.

The first wiring unit may be a data line that provides a data signal to the display unit, and the second wiring unit may be a power line that supplies driving power to the display unit.

The first bending portion may have a pattern bent with a straight line or bent with a curve in a first direction and in a second direction crossing with the first direction.

The first bending portion may include a first line and a second line spaced apart from the first line by a first distance to form a pair that are disposed adjacent to each other, and may include at least one first bridge line between the first line and the second line to electrically connect the first line to the second line.

The first bending portion may include a first portion where the first line and the second line are parallel to each other in the first direction and a second portion where the first line and the second line are parallel to each other in the second direction. The first bridge line may be disposed at each of the first portion and the second portion.

The first bridge line may connect the first line to the second line with a smallest distance.

The first bending portion may further include a third line spaced apart from the second line by a second distance, the second line and the third line being disposed adjacent to each other, and may further include at least one second bridge line between the second line and the third line to electrically connect the second line to the third line.

The first distance and the second distance may be identical with each other.

The second bending portion may have a straight line shape.

The display apparatus may further include first pads and second pads on one end of the substrate, wherein the first wiring unit is connected to the first pads and the second wiring unit is connected to the second pads.

The display unit may be in the first region of the substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
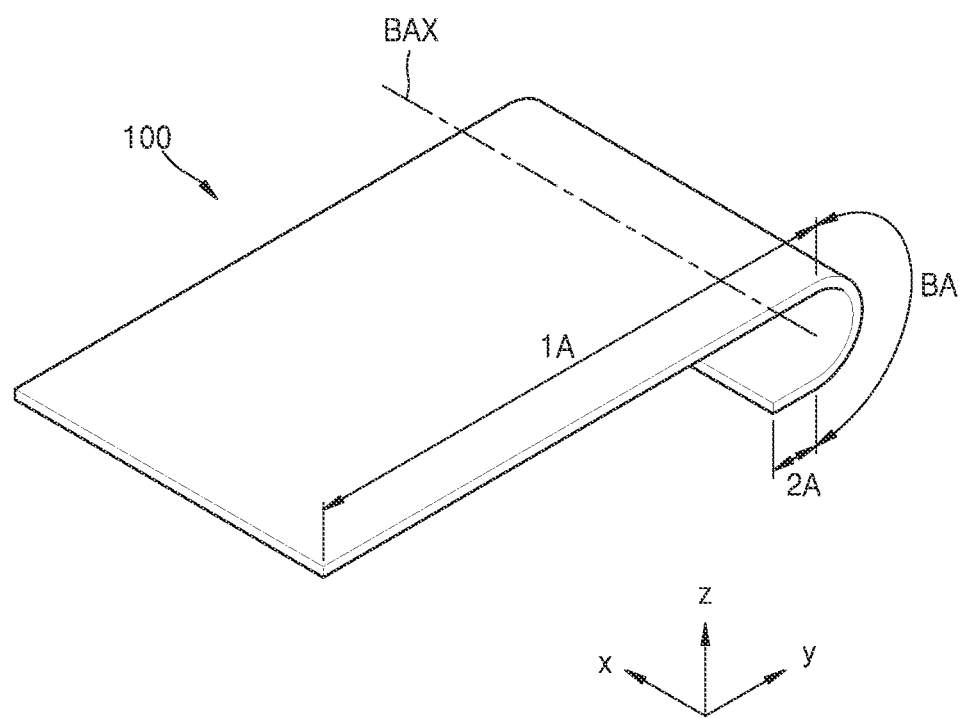
FIG. 1 is a schematic partial plan view of an organic light-emitting display device according to an embodiment of the present invention.

Reference will now be made in detail to embodiments, examples of which are illustrated in the accompanying drawings, wherein like reference numerals refer to like elements (or components) throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As the invention allows for various changes and numerous embodiments, particular embodiments will be illustrated in the drawings and described in detail in the written description. Hereinafter, features of the present invention and a method for accomplishing them will be described more fully with reference to the accompanying drawings, in which embodiments of the invention are shown. This invention may, however, be embodied in many different forms and should not be construed as limited to the embodiments set forth herein.

One or more embodiments of the invention will be described below in more detail with reference to the accompanying drawings. Those components that are the same or are in correspondence are rendered the same reference numeral regardless of the figure number, and redundant explanations may be omitted.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

Spatially relative terms, such as "top," "bottom," "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Sizes of elements (or components) in the drawings may be exaggerated for convenience of explanation. In other words, because sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Embodiments of the present invention may be implemented differently from those described herein and a specific process order may be performed differently from the order described herein. For example, two consecutively described processes may be performed substantially at the same time or performed in an order opposite to the described order.

Figure 2:
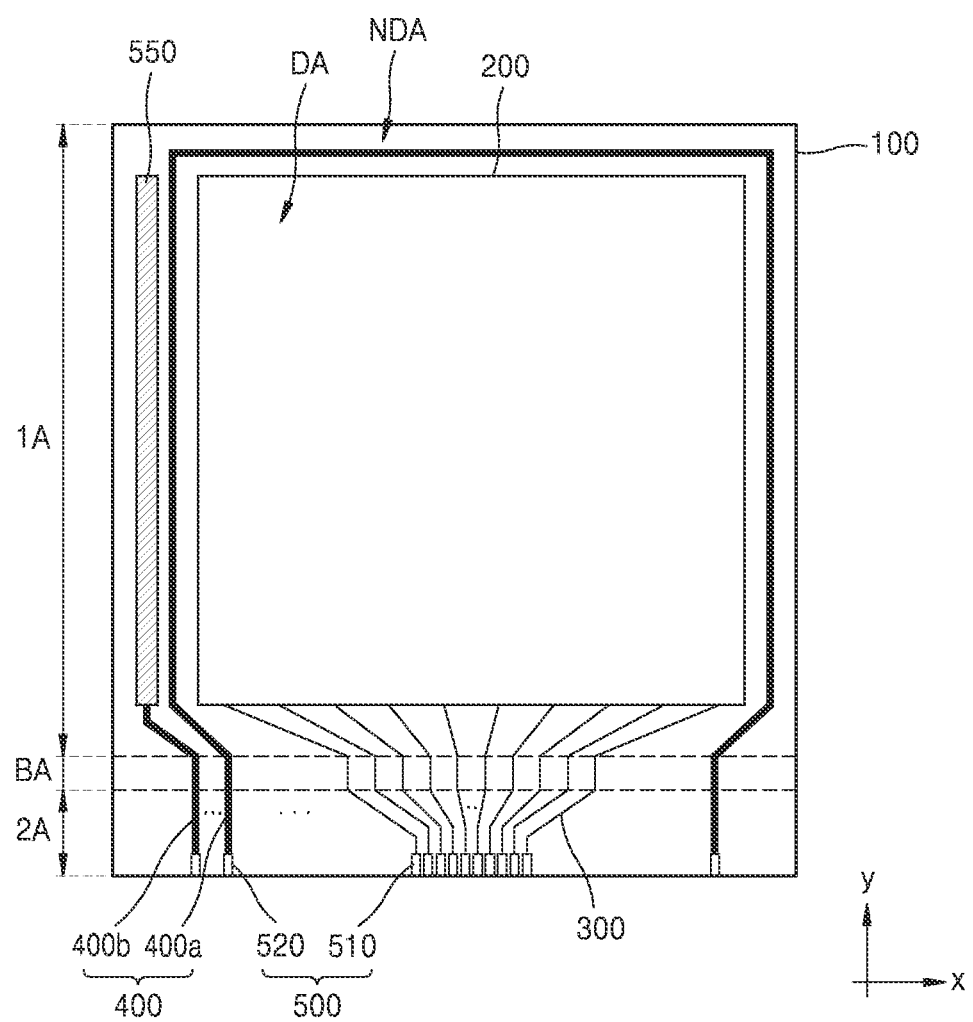
FIG. 2 is a schematic plan view of a display unit of the display apparatus of FIG. 1.

FIG. 1 is a schematic perspective view of a portion of a display apparatus according to an embodiment of the present invention. FIG. 2 is a schematic plan view of a structure of the display apparatus of FIG. 1 that is not yet bent.

As shown in FIG. 1, a portion of a substrate 100, which is a portion of the display apparatus according to the present embodiment, is bent, and thus the portion of the display apparatus has a bent shape like the substrate 100. However, for convenience of explanation, FIG. 2 illustrates a not-yet-bent display apparatus. For reference, cross-sectional views, plan views, and/or the like regarding embodiments to be described later illustrate a not-yet-bent display apparatus for convenience of illustration and description.

Referring to FIGS. 1 and 2, the substrate 100 included in the display apparatus according to the present embodiment has a bending region BA extending in one direction (+x direction). The bending region BA is between a first region 1A and a second region 2A, in another direction (+y direction) that crosses with the one direction (+x direction). As shown in FIG. 1, the substrate 100 is bent with respect to a bending axis BAX extending in the one direction (+x direction).

The substrate 100 may include various suitable materials having flexible or bendable characteristics. For example, the substrate 100 may include a polymer resin, such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC), and/or cellulose acetate propionate (CAP).

The first region 1A includes a display region DA. As shown in FIG. 2, the first region 1A includes a portion of a non-display region around the display region DA. The second region 2A includes the non-display region NDA.

The display region DA of the first region 1A may include a display unit 200 (e.g., a display 200). The display unit 200 may include a display device 250, and may display an image by controlling a display device 250 (see FIG. 3) to emit light. A structure of the display unit 200 will be described below in detail with reference to FIG. 3.

A first wiring unit 300 and a second wiring unit 400 may be on the substrate 100. The first wiring unit 300 and the second wiring unit 400 may be at the non-display region NDA around the display region DA, as shown in FIG. 2, and may extend over the first region 1A, the second region 2A, and the bending region BA. In other words, at least portions of the first wiring unit 300 and the second wiring unit 400 may overlap with the bending region BA.

The first wiring unit 300 and the second wiring unit 400 may each be electrically connected to the display unit 200. The first wiring unit 300 may be a line that transmits a data signal to the display unit 200. For example, the first wiring unit 300 may be a data line. The second wiring unit 400 may be spaced apart from the first wiring unit 300. The second wiring unit 400 may include a power line 400a supplying driving power to the display unit 200, and a driving circuit line 400b applying a signal to a scan driving circuit 550. The scan driving circuit 550 may be a shift register. For example, the power line 400a may be an ELVDD line, an ELVSS line, or the like, and the driving circuit line 400b may be a scan line or a gate line.

According to an example embodiment, the first wiring unit 300 and the second wiring unit 400 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tungsten (W), and copper (Cu). Each of the first wiring unit 300 and the second wiring unit 400 may have a single-layered or multi-layered structure.

A pad unit 500 may be on one end of the substrate 100 and may include a first pad unit 510 (e.g., first pads 510) and a second pad unit 520 (e.g., second pads 520). Special chips and/or the like may be on the first pad unit 510 and the second pad unit 520. The first wiring unit 300 may be connected to the first pad unit 510 and the second wiring unit 400 may be connected to the second pad unit 520, and thus the first wiring unit 300 and the second wiring unit 400 may transmit a signal applied to the pad unit 500 to the display unit 200 via the chips.

However, in the related art, a first wiring unit and a second wiring unit are formed as simple straight lines. In a display apparatus having a bending region as in the present embodiment, stress concentrates on portions of the first wiring unit and the second wiring unit that overlap with a bending region, and thus the portions of the first wiring unit and the second wiring unit may have cracks, leading to defects such as disconnections.

However, in the display apparatus according to the present embodiment, a first bending portion 310 (see FIG. 4) and a second bending portion 410 (see FIG. 4) may be respectively included as the portions of the first wiring unit 300 and the second wiring unit 400 that overlap with the bending region BA.

In the description below, the shapes or forms of the first bending portion 310, the first wiring unit 300 (including the first bending portion 310), the second bending portion 410, and the second wiring unit 400 (including the second bending portion 410) may be understood as referring to the shapes or forms of the wirings on a plane (X-Y plane). When an element is described as having a shape or a form, it is not referring to the widths, breadths, or thicknesses of the individual lines, but rather, it is referring to the shape or form of the lines as a whole.

The first wiring unit 300 may include the first bending portion 310, and the first bending portion 310 may face the bending region BA. The first bending portion 310 may have a planar shape in which a certain pattern is repeated, instead of having a simple straight line shape. The second wiring unit 400 may include the second bending portion 410, and the second bending portion 410 may face the bending region BA. The second bending portion 410 may have a planar shape in which a certain pattern is repeated, similar to the first bending portion 310. According to the present embodiment, the first bending portion 310 and the second bending portion 410 may have different shapes.

According to another embodiment, the second bending portion 410 of the second wiring unit 400 may not have the planar shape in which a certain pattern is repeated. In other words, the second wiring unit 400 may have a simple straight line shape and face the bending region BA. In other words, the second wiring unit 400 may have a constant width and a constant thickness even at the second bending portion 410 overlapping with the bending region BA, and the second bending portion 410 may be formed to have the same or substantially the same shape as portions of the second wiring unit 400 that are located on the first region 1A and the second region 2A. The first bending portion 310 may have a straight line shape and may still have a different shape from the second bending portion 410.

According to the present embodiment, the first wiring unit 300 may have a first resistance value, and the second wiring unit 400 may have a second resistance value. The second resistance value of the second wiring unit 400 may be less than the first resistance value of the first wiring unit 300, because the first bending portion 310 included in the first wiring unit 300 and the second bending portion 410 included in the second wiring unit 400 may have different shapes. In other words, assuming that a thickness and a width of a portion of the first wiring unit 300, except for the first bending portion 310, are identical with those of a portion of the second wiring unit 400, except for the second bending portion 410, the second resistance value of the second wiring unit 400 including the second bending portion 410 may be less than the first resistance value of the first wiring unit 300 including the first bending portion 310.

This may be understood as the second bending portion 410 having lower resistance than the first bending portion 310. As the first bending portion 310 and the second bending portion 410 have different shapes of patterns, when an identical current is applied to the first bending portion 310 and the second bending portion 410, resistance applied to the first bending portion 310 may be different from resistance applied to the second bending portion 410. According to the present embodiment, the resistance applied to the second bending portion 410 may be less than the resistance applied to the first bending portion 310.

As described above, to ease stress concentration on the portions of the first wiring unit 300 and the second wiring unit 400 overlapping with the bending region BA, the first wiring unit 300 may include the first bending portion 310 and the second wiring unit 400 may include the second bending portion 410. Compared with a typical case in which first and second wiring units have straight line shapes, the resistances of the first wiring unit 300 and the second wiring unit 400 respectively including the first bending portion 310 and the second bending portion 410 increase.

Because the first wiring unit 300 is a data line for transmitting a data signal to the display unit 200 and the second wiring unit 400 is the power line 400a for supplying driving power to the display unit 200 or the driving circuit line 400b for applying a signal to the scan driving circuit 550 as described above, the quality of an image of the display unit 200 is more sensitive to the resistance of the second wiring unit 400 than to the resistance of the first wiring unit 300. Thus, the display apparatus according to the present embodiment uses a wiring structure in which the resistance of the second wiring unit 400 including the second bending portion 410 is less than the resistance of the first wiring unit 300 including the first bending portion 310. Accordingly, the flexibility of the portions of the first wiring unit 300 and the second wiring unit 400 overlapping with the bending region BA may improve and stress concentration may be eased. Moreover, the image quality of the display unit 200 may be improved by forming the second wiring unit 400, which supplies driving power to the display unit 200, to have less resistance than the first wiring unit 300.

Figure 3:
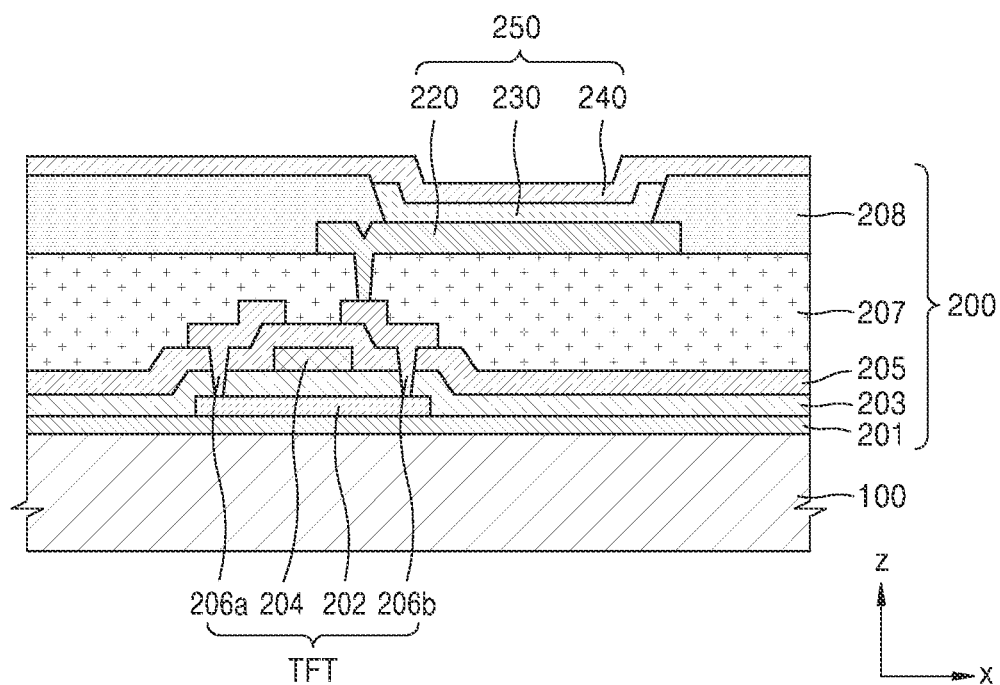
FIG. 3 is a schematic plan view of a display apparatus, which is a modification of the display apparatus of FIG. 1.

FIG. 3 is a schematic plan view of a portion of the display apparatus of FIG. 1. FIG. 3 illustrates a pixel structure of the display unit 200 included in the display apparatus of FIG. 1. According to the present embodiment, the display device 250 of the display unit 200 includes an organic light-emitting device (OLED). However, according to another embodiment, the display device 250 of the display unit 200 may include an inorganic light-emitting device such as a liquid crystal device, an inorganic light-emitting diode ILED, micro light-emitting device μLED, etc.

The display unit 200 may include a thin film transistor TFT, to which the display device 250 is electrically connected, in addition to the display device 250. According to the present embodiment, the display device 250 of the display unit 200 includes an OLED. Electrically connecting the OLED to the thin film transistor TFT may be understood as electrically connecting a pixel electrode 220 to the thin film transistor TFT. The non-display region NDA around the display region DA of the substrate 100 may include the thin film transistor TFT. The thin film transistor TFT in the non-display region NDA as described above may be a portion of a circuit unit (e.g., a circuit) for controlling an electrical signal applied to the display unit 200.

First, to planarize a surface of the substrate 100 and/or prevent or substantially prevent impurities and/or the like from permeating a semiconductor layer 202 of the thin film transistor TFT, a buffer layer 201 may be on the substrate 100, and the semiconductor layer 202 may be on the buffer layer 201. The buffer layer 201 may include a silicon oxide, a silicon nitride, and/or the like.

A gate electrode 204 is over the semiconductor layer 202, and a source electrode 206a and a drain electrode 206b may electrically communicate (e.g., be electrically connected) with each other in response to a signal applied to the gate electrode 204. For example, the gate electrode 204 may be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single- or multi-layered structure, in consideration of adhesion to an adjacent layer, surface smoothness of a layer stacked on the gate electrode 204, and processability.

To secure insulation between the semiconductor layer 202 and the gate electrode 204, a gate insulating layer 203 may be between the semiconductor layer 202 and the gate electrode 204. The gate insulating layer 203 may include a silicon oxide and/or a silicon nitride.

An interlayer insulating layer 205 may be over the gate electrode 204 and may be formed of a silicon oxide, a silicon nitride, and/or the like in a single- or multi-layered structure.

The source electrode 206a and the drain electrode 206b are on the interlayer insulating layer 205. The source electrode 206a and the drain electrode 206b may be electrically connected to the semiconductor layer 202 via respective contact holes formed in both of the interlayer insulating layer 205 and the gate insulating layer 203. For example, the source electrode 206a and the drain electrode 206b may each be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single- or multi-layered structure, in consideration of conductivity and/or the like.

A protective layer may be on the thin film transistor TFT having this structure in order to protect the thin film transistor TFT. The protective layer may be formed of an inorganic material such as silicon oxide, silicon nitride, and/or silicon oxynitride.

A planarization layer 207 may be over the substrate 100. The planarization layer 207 may be a protective layer. When an OLED is over the thin film transistor TFT, the planarization layer 207 substantially planarizes the upper surface of the thin film transistor TFT and protects the thin film transistor TFT and various devices. The planarization layer 207 may be formed of, for example, an acryl-based organic material, benzocyclobutene (BCB), or the like. The buffer layer 201, the gate insulating layer 203, the interlayer insulating layer 205, and the planarization layer 207 may be on the entire surface of the substrate 100.

A pixel defining layer 208 may be on the thin film transistor TFT. The pixel defining layer 208 may be on the above-described planarization layer 207 and may have an aperture. The pixel defining layer 208 may define a pixel region on the substrate 100.

The pixel defining layer 208 may be, for example, an organic insulating layer. The organic insulating layer may include an acryl-based polymer such as polymethyl methacrylate (PMMA), polystyrene (PS), a polymer derivative having a phenol group, an imide-based polymer, an acryl ether-based polymer, an amide-based polymer, a fluorine-based polymer, a p-xylene-based polymer, a vinyl alcohol-based polymer, or a mixture of these materials.

The display device 250 may be on the planarization layer 207. The display device 250 may include the pixel electrode 220, an intermediate layer 230 including an emission layer (EML), and an opposite electrode 240.

The pixel electrode 220 may include a transparent (or semi-transparent) electrode or a reflective electrode. When the pixel electrode 220 includes a transparent (or semi-transparent) electrode, the pixel electrode 220 may be formed of, for example, indium tin oxide (ITO), indium zinc oxide (IZO), zinc oxide (ZnO), indium oxide (In$_2$O$_3$), indium gallium oxide (IGO), or aluminum zinc oxide (AZO). When the pixel electrode 220 includes a reflective electrode, the pixel electrode 220 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a combination thereof, and a layer formed of ITO, IZO, ZnO, In$_2$O$_3$, IGO, or AZO. However, embodiments of the present invention are not limited thereto, and the pixel electrode 220 may be formed of any of various other suitable materials and may have any of various other suitable structures, such as, a single-layered or multi-layered structure.

The intermediate layer 230 may be on each of the pixel regions defined by the pixel defining layer 208. The intermediate layer 230 includes an emission layer (EML) emitting light according to an electrical signal, and may further include a hole injection layer (HIL) and a hole transport layer (HTL) between the EML and the pixel electrode 220, and an electron transport layer (ETL) and an electron injection layer (EIL) between the EML and the opposite electrode 240, in a single or complex stack structure. However, the intermediate layer 230 is not limited to the structure described above, and may have any of various other suitable structures.

The opposite electrode 240 covers the intermediate layer 230 including the EML and faces the pixel electrode 220. The opposite electrode 240 may be on the entire surface of the substrate 100. The opposite electrode 240 may include a transparent (or semi-transparent) electrode or a reflective electrode.

When the opposite electrode 240 includes a transparent (or semi-transparent) electrode, the opposite electrode 240 may include a layer formed of a metal having a small work function, that is, Li, Ca, LiF/Ca, LiF/Al, Al, Ag, Mg, or a combination thereof, and a transparent (or semi-transparent) conductive layer formed of ITO, IZO, ZnO, and/or In$_2$O$_3$. When the opposite electrode 240 includes a reflective electrode, the opposite electrode 240 may include a layer formed of Li, Ca, LiF/Ca, LiF/Al, Al, Ag, Mg, or a combination thereof. The configuration of the opposite electrode 240 and the material used to form the opposite electrode 240 are not limited to those described above, and the opposite electrode 240 may be variously modified.

According to an embodiment, functional layers, such as an encapsulation layer, a polarization layer, and/or a color filter, may be further included on the opposite electrode 240.

Figure 4:
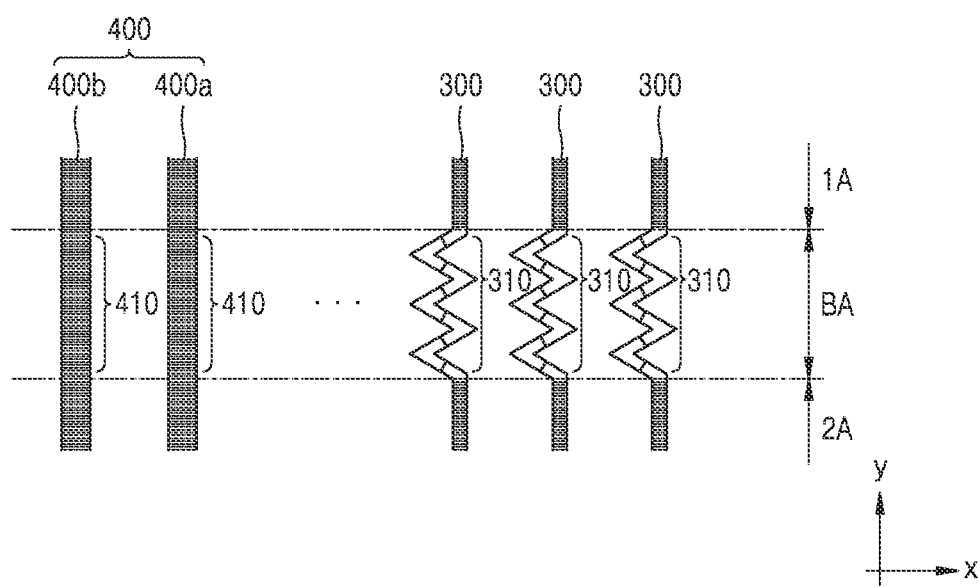
FIG. 4 is a schematic plan view of a display apparatus, which is a modification of the display apparatus of FIG. 1.

FIG. 4 is a schematic plan view of a portion of the display apparatus of FIG. 1. FIG. 4 magnifies and illustrates a portion of a fan-out region where a plurality of first wiring units 300 (e.g., a plurality of first wirings 300) and a plurality of second wiring units 400 (e.g., a plurality of second wirings 400) are consecutively arranged in one direction.

Referring to FIGS. 2 and 4, at least a portion of each of the first wiring units 300 overlaps the bending region BA.

Each of the first wiring units 300 may be a data line that is on one side of the display unit 200 and may deliver a data signal from the display unit 200. Each of the second wiring units 400 may be a power line that is on one side of the display unit 200 and may supply driving power to the display unit 200. Accordingly, a plurality of first wiring units 300 and a plurality of second wiring units 400 may be arranged in one direction, as shown in FIG. 4.

According to the present embodiment, the second wiring unit 400 may have a larger line width than the first wiring unit 300, because more first wiring units 300 are arranged in a relatively narrower area than second wiring units 400 on a wiring layout and the image quality of the display unit 200 improves with a decrease in the resistance of the second wiring units 400, as described above.

The first wiring units 300 may be over the first region 1A, the second region 2A, and the bending region BA, and may include the first bending portions 310 corresponding to the portions overlapping with the bending region BA. Each of the first bending portions 310 may have a pattern shape in which a certain pattern is consecutively repeated. Although FIG. 4 illustrates an embodiment in which each of the first bending portions 310 has a zigzag pattern, the structure of the first bending portion 310 is not limited thereto. The shape of each first bending portion 310 may be a consecutive repetition of a certain pattern. According to another embodiment, each of the first bending portions 310 may have an "S" shape, which is a curve shape, instead of a straight line shape.

As shown in FIG. 4, the first wiring units 300 may also be on the first region 1A and the second region 2A, and portions of the first wiring units 300 overlapping with the first region 1A and the second region 2A, namely, portions of the first wiring units 300, except for the first bending portions 310 overlapping with the bending region BA, may have straight line shapes having no patterns. The first wiring units 300 may each extend in one direction, and the first bending portion 310 of each of the first wiring units 300 may be repeatedly bent in another direction that crosses with the one direction.

However, as shown in FIG. 4, each of the second bending portions 410 may have a straight line shape having no holes. In other words, each second bending portion 410 may have substantially the same shape (e.g., the same shape) as other portions of each second wiring unit 400.

Figure 5:
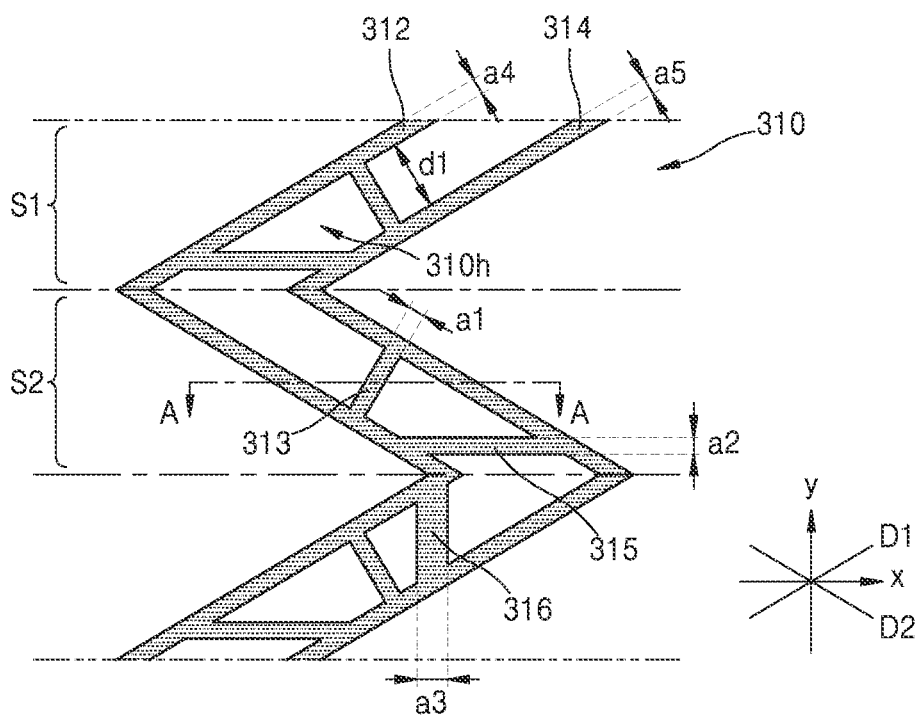
FIG. 5 is a magnified plan view of a portion of an organic light-emitting display device illustrated in FIG. 4.
Figure 6:
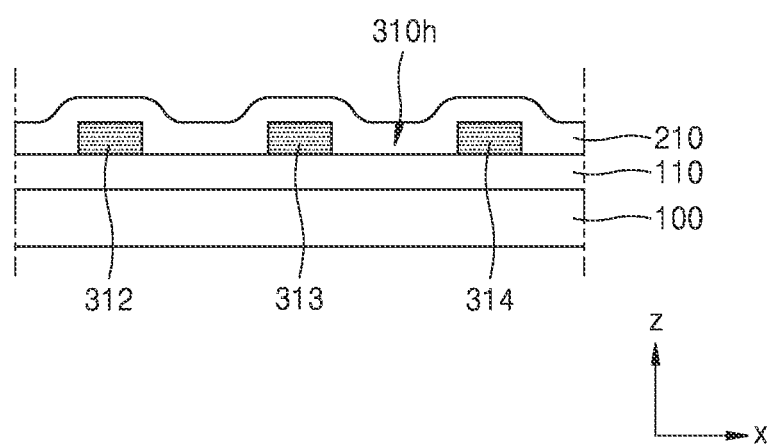
FIG. 6 is a schematic cross-sectional view of a portion of the organic light-emitting display apparatus of FIG. 4, taken along the line A-A of FIG. 5.

FIG. 5 is a magnified plan view of a portion of a first wiring unit 300 of FIG. 4. FIG. 6 is a schematic cross-sectional view of a portion of the display apparatus of FIG. 4, taken along the line A-A of FIG. 5.

Referring to FIG. 6, a first insulating layer 110 may be on the substrate 100, and the first wiring unit 300 may be on the first insulating layer 110. The first insulating layer 110 may include an organic insulating layer and/or an inorganic insulating layer. In other words, the first insulating layer 110 may only include an organic insulating layer, may only include an inorganic insulating layer, or may include a stack of an organic insulating layer and an inorganic insulating layer. In FIG. 6, the first insulating layer 110 may have a flat upper surface. However, according to another embodiment, the first insulating layer 110 may have an uneven upper surface such as a wave shape. Referring to FIGS. 3 and 6, when the first wiring unit 300 is on the same level as the gate electrode 204 of the thin film transistor TFT, the buffer layer 201 and/or the gate insulating layer 203 may be between the substrate 100 and the first wiring unit 300. According to another embodiment, when the first wiring unit 300 is on the same level as the source electrode 206a or the drain electrode 206b of the thin film transistor TFT, the buffer layer 201, the gate insulating layer 203, and/or the interlayer insulating layer 205 may be between the substrate 100 and the first wiring unit 300. Other insulating layers may be further disposed.

Referring to FIGS. 5 and 6, the first bending portion 310 of the first wiring unit 300, which overlaps with the bending region BA, may have a pattern in which a planar shape is consecutively repeated. According to an embodiment, the first bending portion 310 may have a plurality of first holes 310h that penetrate through the first bending portion 310. The first bending portion 310 may have the plurality of first holes 310h.

Figure 11:
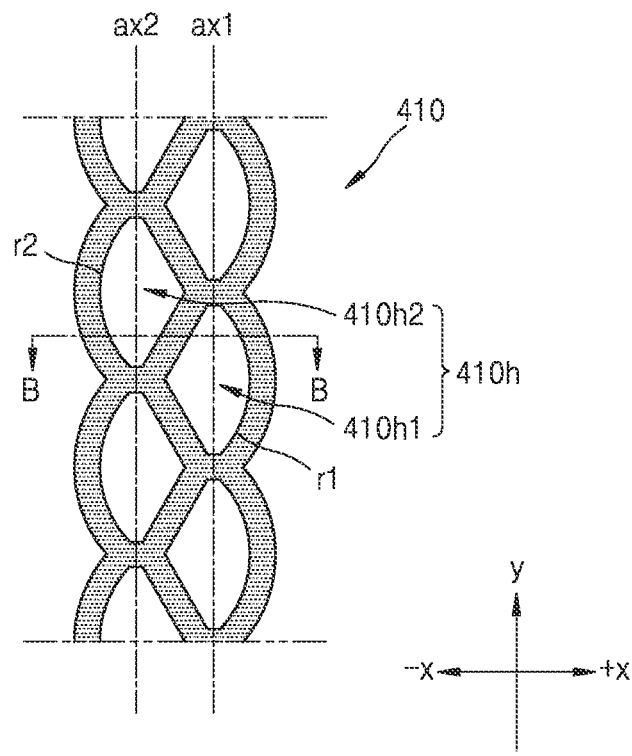
FIG. 11 is a magnified plan view of a portion of the organic light-emitting display device illustrated in FIG. 10.
Figure 12:
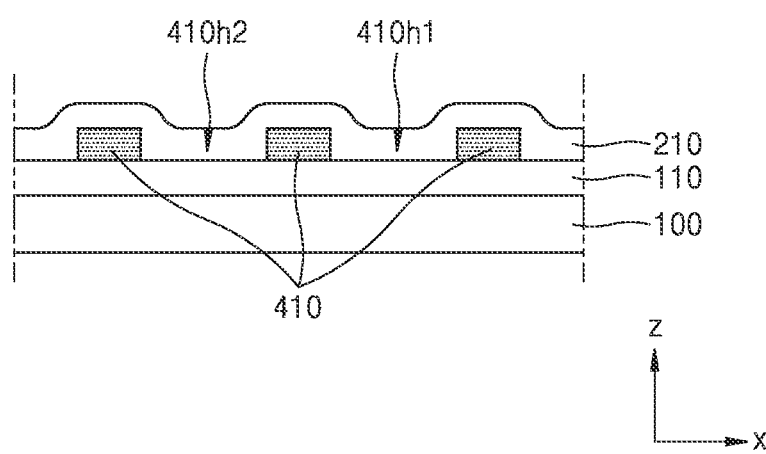
FIG. 12 is a schematic cross-sectional view of a portion of the organic light-emitting display apparatus of FIG. 11, taken along the line B-B of FIG. 11.

Although described below, FIGS. 11 and 12 illustrate the shape of a second bending portion 410 of a second wiring unit 400 that overlaps with the bending region BA. The second bending portion 410 may have a pattern in which a planar shape is consecutively repeated. According to an embodiment, the second bending portion 410 may have a plurality of second holes 410h that penetrate through the second bending portion. The second bending portion 410 may have the plurality of second holes 410h. The first bending portion 310 and the second bending portion 410 may have different shapes, as described above, and the plurality of first holes 310h of the first bending portion 310 may have different shapes from the plurality of second holes 410h of the second bending portion 410, as described below. According to another embodiment, the number of first holes 310h of the first bending portion 310 may be different from the number of second holes 410h of the second bending portion 410.

According to another embodiment, the second bending portion 410 may have a straight line shape having no holes.

According to the present embodiment, the plurality of first holes 310h may have different planar shapes from the plurality of second holes 410h. This may be understood as the first bending portion 310 and the second bending portion 410 having different planar shapes. This planar shape difference causes a difference between the resistances of the first wiring unit 300 and the second wiring unit 400, and the second wiring unit 400 may have a relatively lower resistance value than the first wiring unit 300.

Referring back to FIGS. 5 and 6, the first bending portion 310 may have a zigzag pattern in which bending in a first direction D1 and bending in a second direction D2 crossing with the first direction D1 alternate with each other. The first direction D1 and the second direction D2 may be different from a bending axis direction. In other words, when the bending axis direction is an X-axis direction, the first direction D1 and the second direction D2 may be understood as being diagonal directions that do not follow the X-axis direction. The first direction D1 and the second direction D2 may cross with both of the X-axis direction and the Y-axis direction.

According to the present embodiment, the first bending portion 310 may include a first line 312, a second line 314, and a first bridge line 313 connecting the first line 312 with the second line 314. The first line 312 and the second line 314 may be apart by a first distance d1 from each other to be adjacent (e.g., close or closest) to each other, and thus may form a pair. To electrically connect the first line 312 to the second line 314, at least one first bridge line 313 may be between the first line 312 and the second line 314.

The first bending portion 310 may include a first portion 51 and a second portion S2 according to directions in which the first line 312 and the second line 314 extend. The first line 312 and the second line 314 in the first portion 51 may be arranged parallel to each other in the first direction D1, and the first line 312 and the second line 314 in the second portion S2 may be arranged parallel to each other in the second direction D2, which crosses with the first direction D1. The first bridge lines 313 may be arranged in the first portion 51 and the second portion S2, respectively. Although the first bridge lines 313 are in centers of the first portion 51 and the second portion S2 in FIG. 5, embodiments of the present invention are not limited thereto. The first bridge lines 313 may connect the first line 312 to the second line 314 at other locations of the first bridge lines 313 and are not limited to the locations shown in the figures.

The first bridge lines 313 may be arranged to connect the first line 312 to the second line 314. According to the present embodiment, the first bridge lines 313 may be arranged to connect the first line 312 to the second line 314 with small lengths (e.g., minimum lengths), because a resistance of a line is proportional to a length of the line and thus the resistance of the line decreases as the length of the line decreases. Accordingly, a length of each first bridge line 313 may be equal or substantially equal to the first distance d1 between the first line 312 and the second line 314.

Each of the plurality of first holes 310h may be defined by the first line 312, the second line 314, and two first bridge lines 313. When a plurality of first bridge lines 313 are included, the two first bridge lines 313 may be two first bridge lines 313 that are adjacent (e.g., close or closest) to each other. A planar shape of each of the plurality of first holes 310h is not limited thereto, and may be realized in various embodiments.

According to an embodiment, second bridge lines 315 connecting the first line 312 to the second line 314 may be included. Different from the first bridge lines 313, each of the second bridge lines 315 may extend in a bending axis direction (x direction). In other words, when the first bridge lines 313 extend in a direction crossing with the bending-axis direction (x direction), the second bridge lines 315 may extend in the bending-axis direction (x direction). When a bridge line extends in the direction crossing with the bending-axis direction (x direction), a stress applied to the bridge line when the substrate 100 is bent or folded in the bending-axis direction (x direction) may increase, and thus cracking or disconnection may occur in the bridge line. Thus, as each of the second bridge lines 315 extends in the bending-axis direction (x direction), a stress applied to the second bridge lines 315 may be reduced (e.g., minimized) even when the substrate 100 is bent in the bending-axis direction (x direction).

According to an embodiment, a third bridge line 316 connecting the first line 312 to the second line 314 may be included. Different from the first bridge lines 313 and the second bridge lines 315, the third bridge line 316 may extend in a direction (y direction) perpendicular to the bending axis direction (x direction). A line width a3 of the third bridge line 316 may be greater than a line width a4 of the first line 312 and/or a line width a5 of the second line 314. A tensile stress may be strongly applied to a bent portion of the third bridge line 316, and thus the third bridge line 316 may be highly likely to be disconnected. However, this disconnection may be prevented or substantially prevented by thickening the line width a3 of the third bridge line 316.

According to an embodiment, a line width a1 of each first bridge line 313, a line width a2 of each second bridge line 315, and the line width a3 of the third bridge line 316 may be different from the line width a4 of the first line 312 and/or the line width a5 of the second line 314.

As shown in FIG. 5, all of the first bridge lines 313, the second bridge lines 315, and the third bridge line 316 may be between the first line 312 and the second line 314. According to another embodiment, only the first bridge lines 313, only the second bridge lines 315, or only the third bridge line 316 may be included between the first line 312 and the second line 314. According to another embodiment, the first bridge lines 313 and the second bridge lines 315 may be included between the first line 312 and the second line 314, or the first bridge lines 313 and the third bridge line 316 may be included between the first line 312 and the second line 314, or the second bridge lines 315 and the third bridge line 316 may be included between the first line 312 and the second line 314.

Referring to FIG. 6, the first wiring unit 300 may be on the substrate 100, and a second insulating layer 210 may be on the first wiring unit 300 to cover the first wiring unit 300. The second insulating layer 210 may be the interlayer insulating layer 205 or the planarization layer 207 of FIG. 3. When the second insulating layer 210 is the interlayer insulating layer 205, the first wiring unit 300 may be formed of the same or substantially the same material as that used to form the gate electrode 204 of the thin film transistor TFT and may be on the same level as the gate electrode 204. According to another embodiment, when the second insulating layer 210 is the planarization layer 207, the first wiring unit 300 may be formed of the same or substantially the same material as that used to form the source electrode 206a or the drain electrode 206b of the thin film transistor TFT and may be on the same level as the source electrode 206a or the drain electrode 206b. A portion of the second insulating layer 210 may be in the plurality of first holes 310h that penetrate through the first wiring unit 300.

Figure 7:
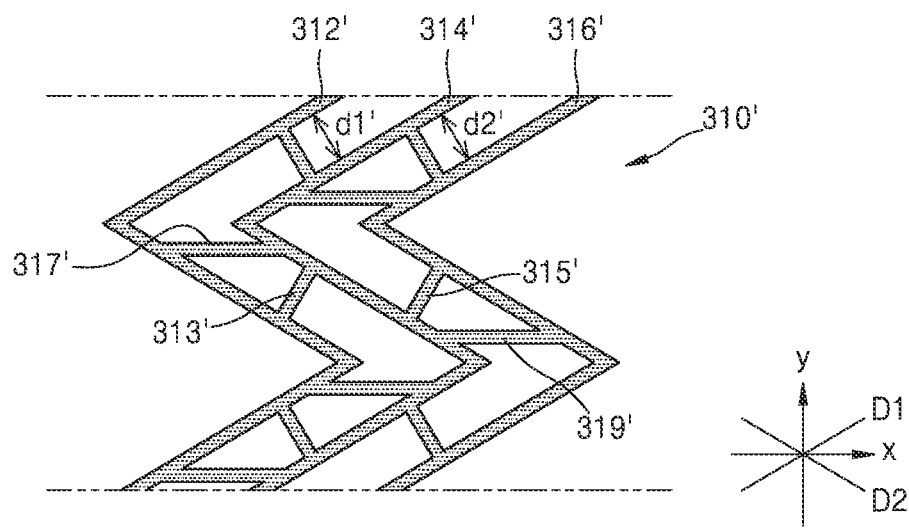
FIG. 7 is a cross-sectional view schematically illustrating an organic light-emitting display apparatus according to another embodiment of the present invention.

FIG. 7 is a schematic plan view of a portion of a display apparatus according to another embodiment of the present invention. FIG. 7 illustrates the shape of a first bending portion 310' according to another embodiment. The first bending portion 310' of FIG. 7 may include an addition of a third line 316' and a second bridge line 315' to the first bending portion 310 of FIG. 5.

Referring to FIG. 7, the first bending portion 310' may have a zigzag pattern in which bending in the first direction D1 and bending in the second direction D2 crossing with the first direction D1 alternate with each other. The first direction D1 and the second direction D2 may be different from a bending axis direction. In other words, when the bending axis direction is an X-axis direction, the first direction D1 and the second direction D2 may be understood as being diagonal directions that do not follow the X-axis direction. The first direction D1 and the second direction D2 may cross with both of the X-axis direction and the Y-axis direction.

According to the present embodiment, the first bending portion 310' may include a first line 312', a second line 314', and a first bridge line 313' connecting the first line 312' with the second line 314'. The first line 312' and the second line 314' may be apart by a first distance d1' from each other to be adjacent (e.g., close or closest) to each other, and thus may form a pair. To electrically connect the first line 312' to the second line 314', at least one first bridge line 313' may be between the first line 312' and the second line 314'.

The first bending portion 310' may include a third line 316' disposed apart by a second distance d2' from either the first line 312' or the second line 314' so as to be adjacent (e.g., close or closest) to either the first line 312' or the second line 314'. At least one second bridge line 315' may be between either the first line 312' or the second line 314' and the third line 316'. When the third line 316' is spaced apart from the first line 312' by the second distance d2' and the first line 312' and the third line 316' are disposed adjacent to each other, the second bridge line 315' may connect the first line 312' to the third line 316'. When the third line 316' is spaced apart from the second line 314' by the second distance d2' and the second line 314' and the third line 316' are disposed adjacent to each other, the second bridge line 315' may connect the second line 314' to the third line 316'.

According to the present embodiment, the first distance d1' between the first line 312' and the second line 314' may be equal or substantially equal to the second distance d2' between either the first line 312' or the second line 314' and the third line 316'. However, the inventive concept is not limited thereto, and the first distance d1' and the second distance d2' may be different from each other.

According to an embodiment, third bridge lines 317' connecting the first line 312' to the second line 314' may be included. Different from the first bridge lines 313', each of the third bridge lines 317' may extend in a bending axis direction (x direction). In other words, when the first bridge lines 313' extend in a direction crossing with the bending-axis direction (x direction), the third bridge lines 317' may extend in the bending-axis direction (x direction). When a bridge line extends in the direction crossing with the bending-axis direction (x direction), a stress applied to the bridge line when the substrate 100 is bent or folded in the bending-axis direction (x direction) may increase, and thus cracking or disconnection may occur in the bridge line. Thus, as each of the third bridge lines 317' extends in the bending-axis direction (x direction), a stress applied to the third bridge lines 317' may be reduced (e.g., minimized) even when the substrate 100 is bent in the bending-axis direction (x direction).

Similar to the above-described third bridge lines 317', fourth bridge lines 319' connecting the second line 314' to the third line 316' may be included.

According to an embodiment, a bridge line, such as the third bridge line 316 of FIG. 5, may be further between the first line 312' and the second line 314', in the direction (y direction) perpendicular to the bending-axis direction (x direction). A bridge line, such as the third bridge line 316 of FIG. 5, may be further between the second line 314' and the third line 316', in the direction (y direction) perpendicular to the bending-axis direction (x direction). Line widths of these bridge lines may be greater than line widths of the first line 312', the second line 314', and the third line 316'.

According to an embodiment, the line width of each first bridge line 313', the line width of each second bridge line 315', the line width of each third bridge line 317', the line width of each fourth bridge line 319', and the line width of the bridge line may be different from the line width of the first line 312', the line width of the second line 314', and/or the line width of the third line 316'.

As shown in FIG. 7, all of the first bridge lines 313', the second bridge lines 315', the third bridge lines 317', the fourth bridge lines 319', and the bridge line may be included between the first line 312', the second line 314', and the third line 316'. Alternatively, at least one of each first bridge line 313', each second bridge line 315', each third bridge line 317', each fourth bridge line 319', and the bridge line may be included between the first line 312', the second line 314', and the third line 316'.

Figure 8:
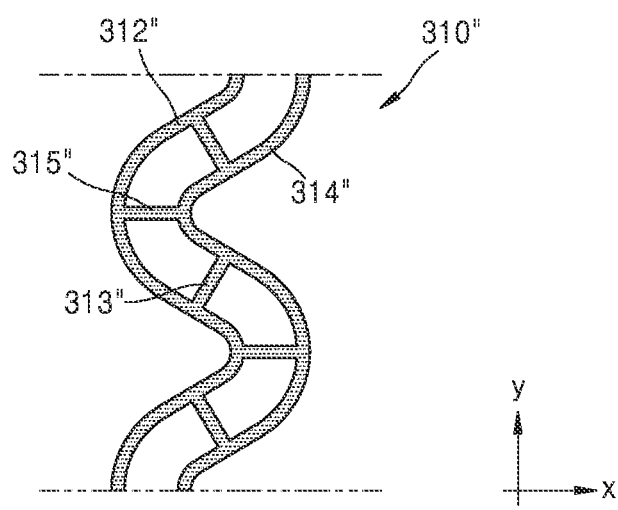
FIG. 8 is a cross-sectional view schematically illustrating an organic light-emitting display apparatus according to another embodiment of the present invention.

FIG. 8 is a schematic plan view of a portion of a display apparatus according to another embodiment of the present invention. FIG. 8 illustrates the shape of a first bending portion 310" according to another embodiment. The first bending portion 310" of FIG. 8 may have a shape in which a first line 312" and a second line 314" are curved lines.

Referring to FIG. 8, the first bending portion 310" may have an "S" shaped pattern in which bending in a first direction and bending in a second direction crossing with the first direction alternate with each other. The first direction and the second direction may be different from a bending axis direction. In other words, when a bending axis direction is a row direction, the first direction and the second direction may be understood as being diagonal directions that do not follow the row direction.

According to the present embodiment, the first bending portion 310" may include a first line 312", a second line 314", and a first bridge line 313" connecting the first line 312" with the second line 314". The first line 312" and the second line 314" may be apart by a first distance from each other to be adjacent (e.g., close or closest) to each other, and thus may form a pair. To electrically connect the first line 312" to the second line 314", at least one first bridge line 313" may be between the first line 312" and the second line 314".

The first line 312" and the second line 314" may have planar shapes that are curves. According to another embodiment, each of the first line 312" and the second line 314" may have a planar shape that is a combination of a straight line and a curve.

According to an embodiment, second bridge lines 315" connecting the first line 312" to the second line 314" may be included. Different from the first bridge lines 313", each of the second bridge lines 315" may extend in a bending axis direction (x direction). In other words, when the first bridge lines 313" extend in a direction crossing with the bending-axis direction (x direction), the second bridge lines 315" may extend in the bending-axis direction (x direction). When a bridge line extends in the direction crossing with the bending-axis direction (x direction), a stress applied to the bridge line when the substrate 100 is bent or folded in the bending-axis direction (x direction) may increase, and thus cracking or disconnection may occur in the bridge line. Thus, as each of the second bridge lines 315" extends in the bending-axis direction (x direction), a stress applied to the second bridge lines 315" may be reduced (e.g., minimized) even when the substrate 100 is bent in the bending-axis direction (x direction).

According to an embodiment, a third bridge line connecting the first line 312" to the second line 314" may be included. Different from the first bridge lines 313" and the second bridge lines 315", the third bridge line may extend in a direction (y direction) perpendicular to the bending axis direction (x direction). A line width of the third bridge line may be greater than a line width of the first line 312" and/or a line width of the second line 314". A tensile stress may be strongly applied to a bent portion of the third bridge line, and thus the third bridge line may be highly likely to be disconnected. However, this disconnection may be prevented or substantially prevented by thickening the line width of the third bridge line.

According to an embodiment, the line width of each first bridge line 313", the line width of each second bridge line 315", and the line width of the third bridge line may be different from the line width of the first line 312" and/or the line width of the second line 314".

As shown in FIG. 8, all of the first bridge lines 313", the second bridge lines 315", and the third bridge line may be between the first line 312" and the second line 314". According to another embodiment, only the first bridge lines 313", only the second bridge lines 315", or only the third bridge line may be included between the first line 312" and the second line 314". According to another embodiment, the first bridge lines 313" and the second bridge lines 315" may be included between the first line 312" and the second line 314", the first bridge lines 313" and the third bridge line may be included between the first line 312" and the second line 314", or the second bridge lines 315" and the third bridge line may be included between the first line 312" and the second line 314".

Figure 9:
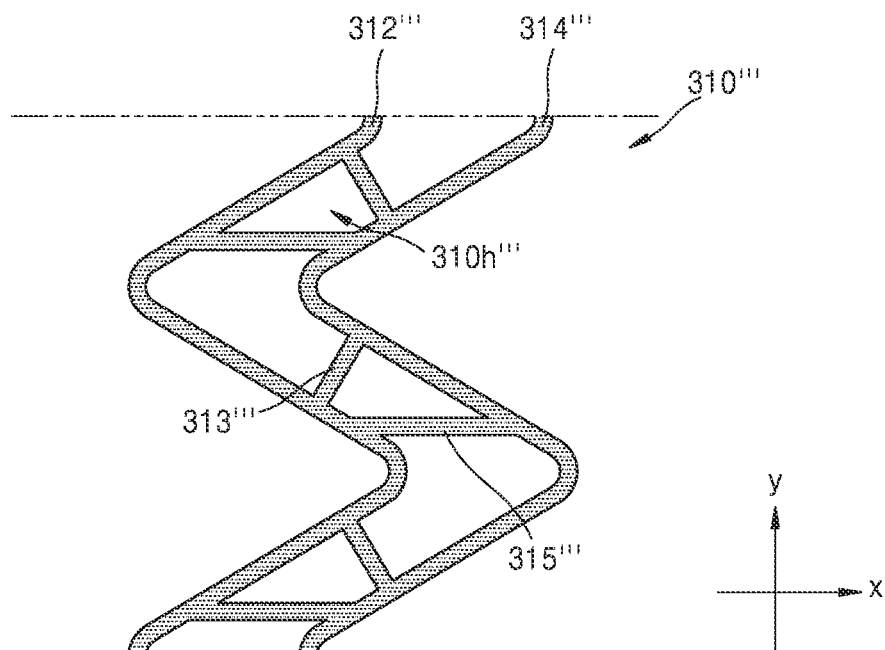
FIG. 9 is a cross-sectional view schematically illustrating an organic light-emitting display apparatus according to an embodiment of the present invention.
Figure 10:
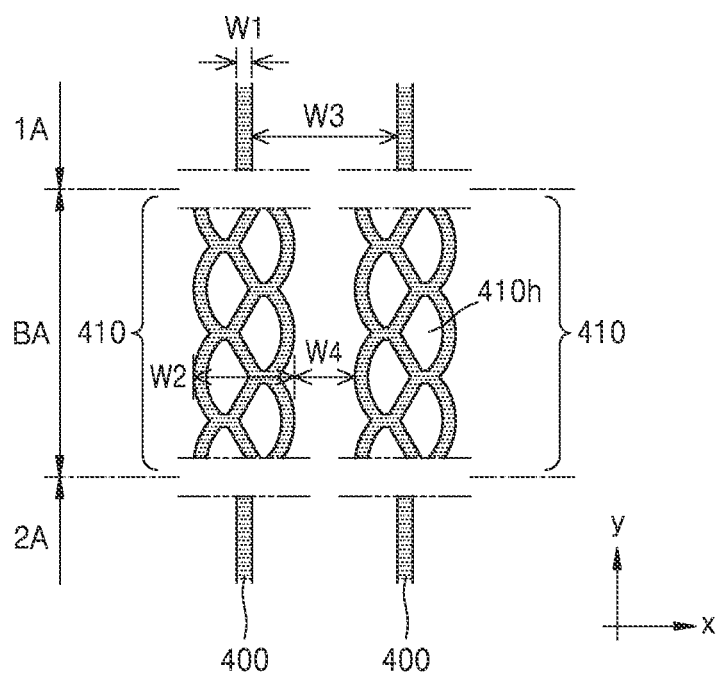
FIG. 10 is a schematic plan view of a display apparatus, which is a modification of the display apparatus of FIG. 1.

FIG. 9 is a schematic plan view of a portion of a display apparatus according to another embodiment of the present invention. FIG. 9 illustrates the shape of a first bending portion 310''' according to another embodiment. The first bending portion 310''' of FIG. 9 may include a first line 312''', a second line 314''', first bridge lines 313''', and second bridge lines 315'''. FIG. 9 is different from FIG. 5 in that cusps where the first line 312''' and the second line 314''' are bent are round. Because the structure of FIG. 9 is similar to that of FIG. 5 except for this difference, a detailed description of FIG. 5 may be omitted. FIG. 10 is a schematic plan view of a portion of the display apparatus of FIG. 1.

Referring to FIG. 10, at least a portion of a second wiring unit 400 may overlap the bending region BA. The second wiring unit 400 may be a power line that is on one side of the display unit 200 and supplies driving power to the display unit 200. Accordingly, a plurality of second wiring units 400 may be arranged in one direction, as shown in FIG. 10.

The second wiring units 400 may be over the first region 1A, the second region 2A, and the bending region BA, and may include the second bending portions 410 corresponding to the portions overlapping with the bending region BA. Each of the second bending portions 410 may have a pattern shape in which a certain pattern is consecutively repeated. The shape of each second bending portion 410 may have a consecutive repetition of a certain pattern, and is not limited to the shape illustrated in FIG. 10.

As shown in FIG. 10, the second wiring units 400 may also be on the first region 1A and the second region 2A, and portions of the second wiring units 400 overlapping with the first region 1A and the second region 2A, namely, portions of the second wiring units 400, except for the second bending portions 410 overlapping with the bending region BA, may have straight line shapes having no patterns. Thus, each second wiring unit 400 may extend in one direction.

According to the present embodiment, a portion of the second wiring unit 400 located on the first region 1A or the second region 2A may have a first width w1, and a portion of the second wiring unit 400 located on the bending region BA, namely, the second bending portion 410, may have a second width w2. The second width w2 may be greater than the first width w1. In other words, the second bending portion 410 has a pattern shape having a plurality of second holes 410h, and a greater width is used to form a pattern than when the second bending portion 410 is formed as a simple straight line. Thus, the width w2 of the portion of the second wiring unit 400 located on the bending region BA may be greater than the width w1 of the portion of the second wiring unit 400 located on the first region 1A or the second region 2A. This may be understood as a pitch w3 between the portions of two adjacent second wiring units 400 located on the first region 1A or the second region 2A being greater than a pitch w4 between two adjacent second bending portions 410 overlapping with the bending region BA.

FIG. 11 is a magnified plan view of a portion of the second wiring unit 400 of FIG. 10. FIG. 12 is a schematic cross-sectional view of a portion of the display apparatus of FIG. 11, taken along the line B-B of FIG. 11.

Referring to FIG. 12, the first insulating layer 110 may be on the substrate 100, and the second wiring unit 400 may be on the first insulating layer 110. The first insulating layer 110 may include an organic insulating layer and/or an inorganic insulating layer. In other words, the first insulating layer 110 may only include an organic insulating layer, may only include an inorganic insulating layer, or may include a stack of an organic insulating layer and an inorganic insulating layer. In FIG. 12, the first insulating layer 110 may have a flat upper surface. However, according to another embodiment, the first insulating layer 110 may have an uneven upper surface such as a wave shape.

Referring to FIGS. 3 and 12, when the second wiring unit 400 is on the same level as the gate electrode 204 of the thin film transistor TFT, the buffer layer 201 and/or the gate insulating layer 203 may be between the substrate 100 and the second wiring unit 400. According to another embodiment, when the second wiring unit 400 is on the same level as the source electrode 206a or the drain electrode 206b of the thin film transistor TFT, the buffer layer 201, the gate insulating layer 203, and/or the interlayer insulating layer 205 may be between the substrate 100 and the second wiring unit 400. According to another embodiment, other insulating layers may be further disposed.

Referring to FIGS. 11 and 12, the second wiring unit 400 may include the second bending portion 410 overlapping with the bending region BA, and may have a plurality of second holes 410h that penetrate through the second bending portion 410.

A planar shape of each of the plurality of second holes 410h may be a fan shape including two straight lines of which respective one ends contact each other to have a certain angle and a curved portion connecting other respective ends of the two straight lines to each other. Although the plurality of second holes 410h have fan-shaped planar shapes in FIG. 11, the inventive concept is not limited thereto, and the planar shapes of the plurality of second holes 410h may be figures formed of curves or straight lines. For example, the planar shape of each of the plurality of second holes 410h may be a polygon, a circle, an oval, a portion of a polygon, a portion of a circle, and/or a portion of an oval.

According to the present embodiment, the plurality of second holes 410h may include (2-1)th holes 410h1 and (2-2)th holes 410h2. The (2-1)th holes 410h1 may be arranged along a first axis ax1, and the (2-2)th holes 410h2 may be arranged along a second axis ax2 that is apart by a distance (e.g., a predetermined distance) from the first axis ax1. Each of the (2-1)th holes 410h1 may have a first curved portion r1 protruding in a first direction (+x direction), and each of the (2-2)th holes 410h2 may have a second curved portion r2 protruding in a second direction (−x direction) opposite to the first direction. The (2-1)th holes 410h1 and (2-2)th holes 410h2 may alternate with each other in a third direction (+y direction) that crosses with the first direction and the second direction.

Referring to FIG. 12, the second wiring unit 400 may be on the substrate 100, and the second insulating layer 210 may be on the second wiring unit 400 to cover the second wiring unit 400. The second insulating layer 210 may be the interlayer insulating layer 205 or the planarization layer 207 of FIG. 3. When the second insulating layer 210 is the interlayer insulating layer 205, the second wiring unit 400 may be formed of the same or substantially the same material as that used to form the gate electrode 204 of the thin film transistor TFT and may be on the same level as the gate electrode 204. According to another embodiment, when the second insulating layer 210 is the planarization layer 207, the second wiring unit 400 may be formed of the same or substantially the same material as that used to form the source electrode 206a or the drain electrode 206b of the thin film transistor TFT and may be on the same level as the source electrode 206a or the drain electrode 206b. A portion of the second insulating layer 210 may be in the plurality of second holes 410h that penetrate through the second wiring unit 400.

Figure 13:
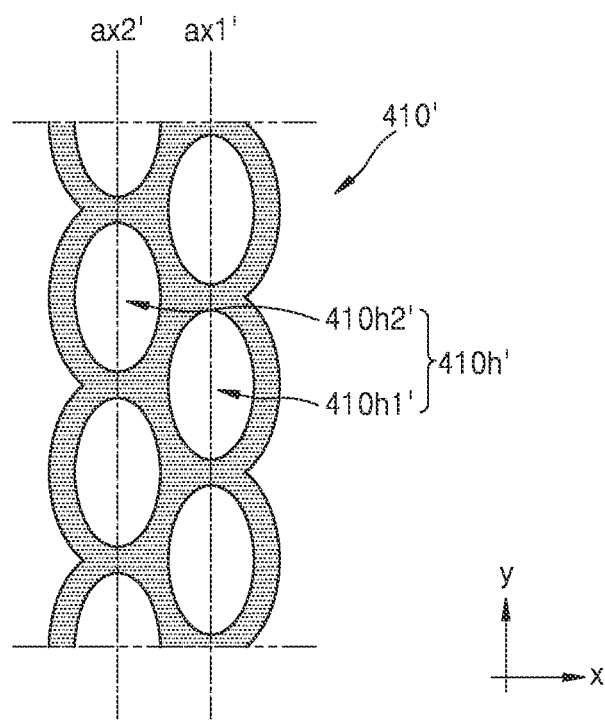
FIG. 13 is a cross-sectional view schematically illustrating an organic light-emitting display apparatus according to an embodiment of the present invention.

FIG. 13 is a schematic plan view of a portion of a display apparatus according to another embodiment of the present invention. FIG. 13 illustrates the shape of a second bending portion 410' according to another embodiment. The second bending portion 410' of FIG. 13 is different from the second bending portion 410 of FIG. 11 in terms of the planar shapes of the plurality of second holes 410h'.

Referring to FIG. 13, a second wiring unit 400 may include the second bending portion 410' overlapping with the bending region BA, and may have a plurality of second holes 410h' that penetrate through the second bending portion 410'. The planar shape of each of the plurality of second holes 410h' may be a circle or oval formed of only curved lines, or a portion of a circle or oval.

According to a selective embodiment, in the bending region BA where the plurality of second holes 410h' are formed, left and right outlines of the second wiring unit 400 may be both curves according to the shapes of the second holes 410h'. In other words, when the outline of the second wiring unit 400 is formed according to the shape of the second holes 410h', not only the second holes 410h' are curves but also the outline of the second wiring unit 400 is a curve like the shapes of the second holes 410h'. Thus, flexibility of the second wiring unit 400 may efficiently improve.

According to the present embodiment, the plurality of second holes 410h' may include (2-1)th holes 410h1' and (2-2)th holes 410h2'. The (2-1)th holes 410h1' may be arranged along a first axis ax1', and the (2-2)th holes 410h2' may be arranged along a second axis ax2' that is apart by a distance (e.g., a predetermined distance) from the first axis ax1'. The (2-1)th holes 410h1' may alternate with the (2-2)th holes 410h2'.

Figure 14:
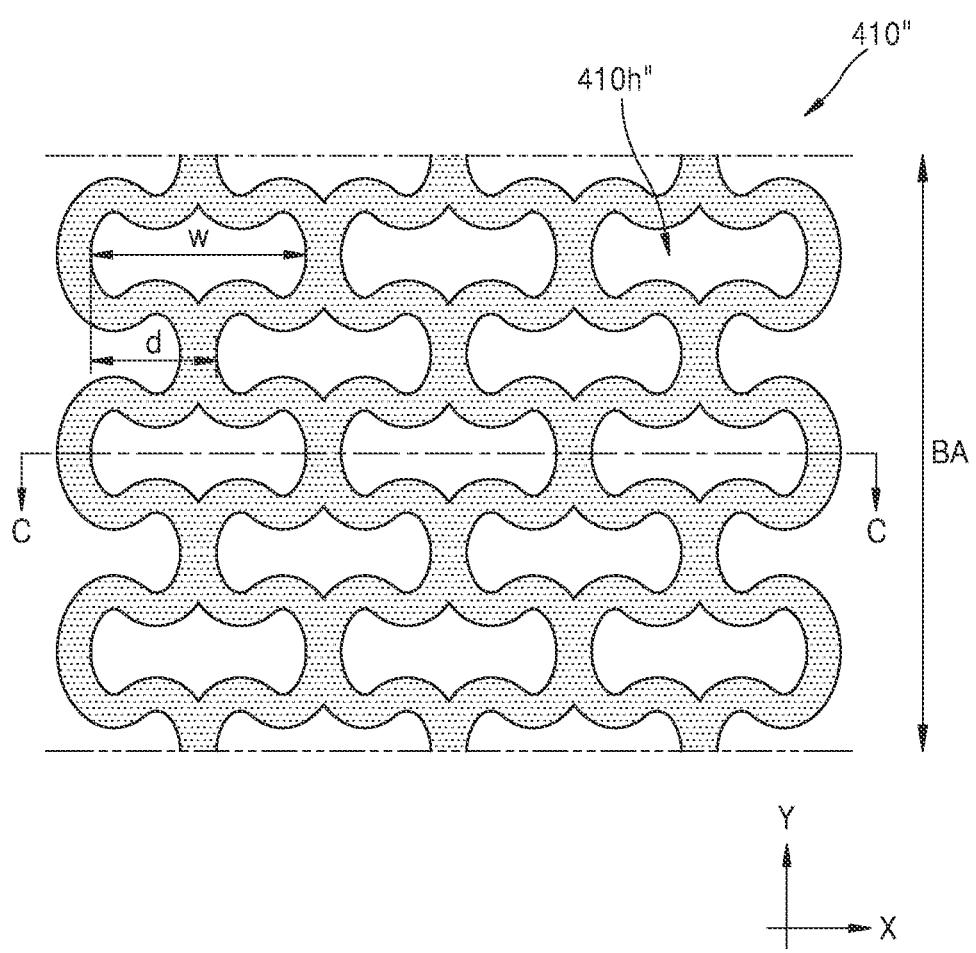
FIG. 14 is a cross-sectional view schematically illustrating an organic light-emitting display apparatus according to another embodiment of the present invention.
Figure 15:
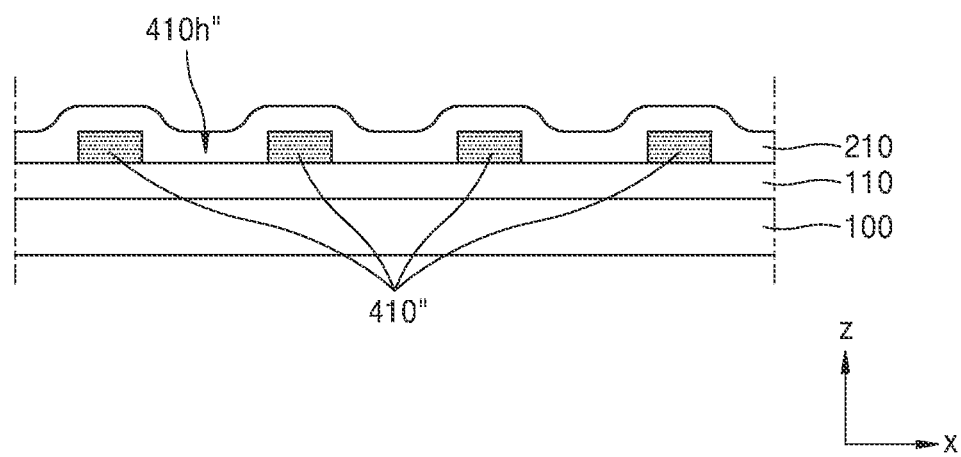
FIG. 15 is a schematic cross-sectional view of the organic light-emitting display apparatus of FIG. 14, taken along the line C-C of FIG. 14.

FIG. 14 is a schematic plan view of a portion of a display apparatus according to another embodiment of the present invention. FIG. 15 is a schematic cross-sectional view of a portion of the display apparatus of FIG. 14, taken along the line C-C of FIG. 14.

Referring to FIGS. 14 and 15, a second bending portion 410" may have a plurality of second holes 410h".

The plurality of second holes 410h" may be arranged to form a plurality of rows. The number of second holes 410h" or the number of rows is not limited, and at least two second holes 410h" may be arranged to form at least two rows. According to an embodiment, as shown in FIG. 14, the plurality of second holes 410h" may have the same or substantially the same planar shapes. The planar shape of each of the plurality of second holes 410h" is not limited to the embodiment of FIG. 14.

According to the present embodiment, second holes on an n-th row may be apart by a first distance d from second holes on an (n-1)th row in a first direction X. In other words, center axes of second holes in a second direction Y on a row do not coincide with those of second holes on its consecutive row in the second direction Y, but the locations of the center axes of the second holes in the second direction (Y) may be different from each other. The second holes on the n-th row may be spaced apart from the second holes on the (n-1)th row in the first direction X, and may be apart by the first distance d rightwards or leftwards from the second holes on the (n-1)th row. According to another embodiment, the first distance d may be less than a width w of each of the second holes on the (n-1)th row. In other words, if the second holes on the n-th row were moved to the (n-1)th row in the second direction Y, the moved second holes may partially overlap the second holes on the (n-1)th row.

According to the embodiment of FIG. 14, center axes of the second holes on a first row, a third row, and a fifth row in the second direction Y are aligned with one another, and center axes of the second holes on a second row and a fourth row in the second direction Y are aligned with one another. However, this is only an embodiment of the present invention and the configuration of the plurality of second holes 410h" is not limited thereto.

A planar shape of each second hole will now be described in detail.

Figure 16:
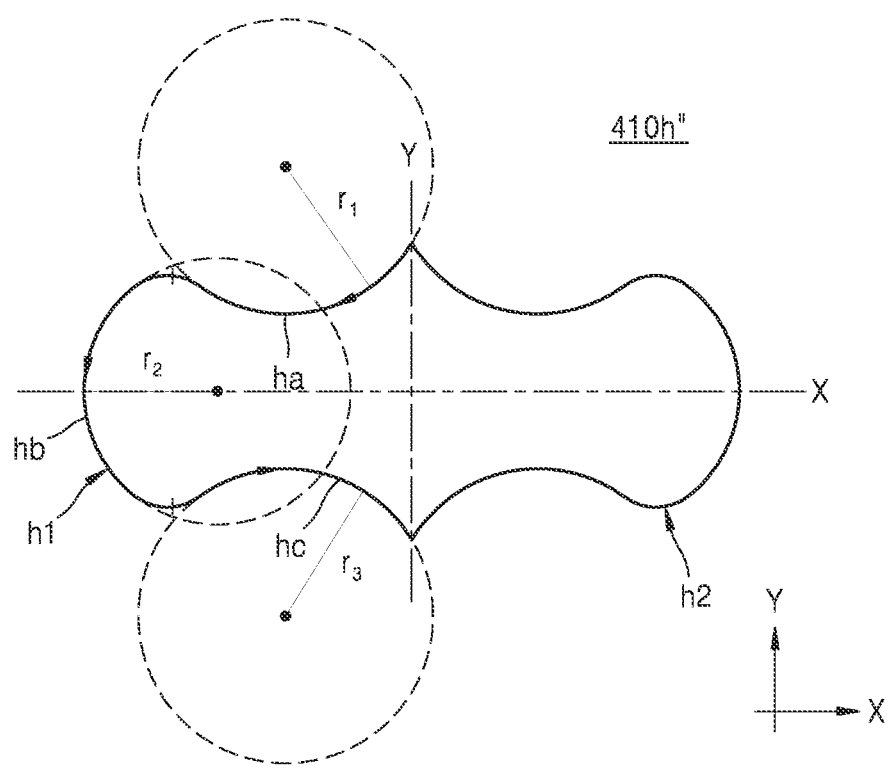
FIG. 16 is a magnified plan view of a portion of the organic light-emitting display device illustrated in FIG. 14.

FIG. 16 is a magnified plan view of a portion of the second bending portion 410" of FIG. 14. FIG. 16 magnifies and illustrates one of the plurality of second holes 410h".

Referring to FIG. 16, the outline of a planar shape of each of the plurality of second holes 410h" according to the present embodiment may be curves. A straight line refers to a line that connects two points to each other with a small length (e.g., a minimum length), and a curve refers to a line generated when a point consecutively moves on a plane or within a space. According to another embodiment, the outline of the second hole 410h" may be formed of only curves without including straight lines.

When the second wiring unit 400 is bent or folded in the bending region BA, as a stress applied to the second wiring unit 400 is dispersed, the risk of the second wiring unit 400 being damaged, for example, disconnected or cracked, may decrease. Thus, in a flexible display apparatus according to the present embodiment, when the outline of the second hole 410h" is formed of only curves, a stress is efficiently dispersed, compared with when the outline of the second hole 410h" includes a straight line. In other words, when the second wiring unit 400 is bent or folded, a greater stress is applied to a straight portion of the outline of the second hole 410h" than to a curved portion thereof. Thus, when the outline of the second hole 410h" is formed of only curves as in the present embodiment, stress concentration during deformation of the second wiring unit 400 may be efficiently prevented or reduced.

Moreover, as shown in FIG. 14, when the plurality of second holes 410h" are formed in the second bending portion 410" of the second wiring unit 400 according to the present embodiment, the outline of the second bending portion 410" may be curves according to the shape of the second holes 410h". In other words, the second wiring unit 400 included in the flexible display apparatus may be bent or folded in the bending region BA, and the plurality of second holes 410h" may be disposed to face the bending region BA. In the bending region BA, where the plurality of second holes 410h" is formed, the outline of the second wiring unit 400 may be curves according to the shapes of the second holes 410h".

According to a selective embodiment, in the bending region BA, where the plurality of second holes 410h" is formed, left and right outlines of the second wiring unit 400 may be both curves according to the shapes of the second holes 410h". In other words, when the outline of the second wiring unit 400 is formed according to the shape of the second holes 410$h''$, not only the second holes 410$h''$ are curves but also the outline of the second wiring unit 400 is a curve like the shapes of the second holes 410$h''$. Thus, flexibility of the second wiring unit 400 may efficiently improve.

However, this is only an embodiment, and even a portion of the outline of the second wiring unit 400 where the plurality of second holes 410$h''$ are formed may be formed as a straight line.

Referring again to FIG. 16, the outline of each of the plurality of second holes 410$h''$ may include a first curved portion h1 and a second curved portion h2. Each second hole 410$h''$ may be formed of the first curved portion h1, which is an outline of a hole formed on the left side of a first axis following the second direction Y, and the second curved portion h2, which is an outline of the hole formed on the right side of the first axis.

According to a selective embodiment, the first curved portion h1 and the second curved portion h2 may be continuously connected to each other. The first curved portion h1 and the second curved portion h2 may respectively include a section rounded clockwise from an arbitrary starting point and a section rounded counterclockwise from an arbitrary starting point. In other words, the first curved portion h1 and the second curved portion h2 respectively include a portion that forms a curve clockwise from an arbitrary starting point and a portion that forms a curve counterclockwise from an arbitrary starting point.

As described above, the first curved portion h1 may include a first section ha, a second section hb, and a third section hc. According to a selective embodiment, the first section ha may be a section rounded clockwise by using a point of the first curved portion h1 located on the first axis, following the second direction Y, as a starting point. The first section ha may be formed to have a first curvature.

A curvature is a change rate representing the bending degree of a curve. When a point on a curve moves along the curve at a constant speed, the traveling direction of the point varies depending on a distance by which the point moved. A change rate refers to the curvature of the curve. A curvature radius r and a curvature have a reciprocal relation. In other words, the value of the curvature may be expressed as a reciprocal of the curvature radius r, namely, as 1/r.

Accordingly, the first section ha may be formed to have a first curvature that may be $1/r_1$, which is a reciprocal of a curvature radius $r_1$.

The first curved portion h1 may include the second section hb connected to the first section ha. According to a selective embodiment, the second section hb may be a section rounded counterclockwise by using a point connected to the first section ha as a starting point. The second section hb may be formed to have a second curvature. The second curvature may be $1/r_2$, which is a reciprocal of a curvature radius $r_2$.

The first curved portion h1 may include the third section hc connected to the second section hb. The third section hc may be a section rounded clockwise by using a point connected to the second section hb as a starting point. The third section hc may be formed to have a third curvature that may be $1/r_3$, which is a reciprocal of a curvature radius $r_3$.

The values of the first curvature $1/r_1$, the second curvature $1/r_2$, the third curvature $1/r_3$ are not limited. The values of the first curvature $1/r_1$, the second curvature $1/r_2$, and the third curvature $1/r_3$ may be all different, two of them may be identical to each other, or all of them may be identical to each other.

As shown in FIG. 16, the second curved portion h2 may be symmetrical to the first curved portion h1, about the second axis (Y axis) following the second direction Y. In other words, the second curved portion h2 may be formed to have the same or substantially the same shape as the first curved portion h1, and the second hole 410$h''$ may have an outline that is bilaterally symmetrical about the second axis (Y axis). According to a selective embodiment, the first curvature $1/r_1$ may be equal or substantially equal to the third curvature $1/r_3$. In other words, the first curved portion h1 may be symmetrical about a first axis (X axis) that follows the first direction X and passes through the first curved portion h1.

According to a selective embodiment, when the first and second curved portions h1 and h2 are formed to be symmetrical to each other about the second axis (Y axis) that follows the second direction Y, the second curved portion h2 may also be formed to be symmetrical about the second axis (Y axis). In other words, the outline of the second hole 410$h''$ may be bilaterally symmetrical about the second axis Y that follows the second direction Y and passes through the center of the second hole 410$h''$, and may also be vertically symmetrical about the first axis X that follows the first direction X and passes through the center of the second hole 410$h''$.

However, in related art, a first wiring unit and a second wiring unit are formed as simple straight lines. In a display apparatus having a bending region as in the present embodiment, stress concentrates on portions of the first wiring unit and the second wiring unit that overlap with a bending region, and thus the portions may have cracks, leading to defects such as a disconnection.

To ease such stress concentration on the portions of the first wiring unit 300 and the second wiring unit 400 overlapping with the bending region BA, the first wiring unit 300 in the display apparatus according to an embodiment may include the first bending portion 310 and the second wiring unit 400 therein may include the second bending portion 410. Compared with a typical case in which first and second wiring units have straight line shapes, the resistances of the first wiring unit 300 and the second wiring unit 400 respectively including the first bending portion 310 and the second bending portion 410 increase. The first wiring unit 300 is a data line transmitting a data signal to the display unit 200 but the second wiring unit 400 is the power line 400$a$ supplying driving power to the display unit 200 or the driving circuit line 400$b$ applying a signal to the scan driving circuit 550 as described above, the quality of an image of the display unit 200 is more sensitive to the resistance of the second wiring unit 400 than to the resistance of the first wiring unit 300. Thus, the display apparatus according to the present embodiment uses a wiring structure in which the resistance of the second wiring unit 400 including the second bending portion 410 is less than the resistance of the first wiring unit 300 including the first bending portion 310. Accordingly, the flexibility of the portions of the first wiring unit 300 and the second wiring unit 400 overlapping with the bending region BA may improve and stress concentration may be eased. Moreover, the image quality of the display unit 200 may be improved by forming the second wiring unit 400, supplying driving power to the display unit 200, to have less resistance than the first wiring unit 300.

According to an embodiment of the present invention as described above, a display apparatus is able to reduce (e.g., minimize) defect occurrences, such as a disconnection, during manufacturing of the display apparatus while securing a long lifespan of the display apparatus. Of course, the scope of the present invention is not limited thereto.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
   a substrate comprising a first region, a second region, and a bending region between the first region and the second region, the bending region being configured to be bent about a bending axis that extends in a first direction;
   a light-emitting device in the first region of the substrate; and
   a wiring extending in a second direction crossing the first direction, the wiring comprising a bending portion across the bending region,
   wherein the bending portion includes a first column of holes arranged in the second direction and a second column of holes arranged in the second direction, wherein the first column of holes and the second column of holes are adjacent to each other, and
   wherein:
   the bending portion comprises a first side edge and a second side edge that are arranged opposite to each other with the first and second columns of holes therebetween;
   the first side edge comprises a first rounded part;
   the second side edge comprises a second rounded part, a third rounded part, and an inflection point at an intersection of the second rounded part with the third rounded part; and
   the inflection point and the first rounded part are aligned on a virtual line extending along a direction perpendicular to the second direction.

2. The display apparatus of claim 1, wherein the first column of holes includes a first hole and the second column of holes includes a second hole and a third hole that are adjacent to each other in the second direction, and
   wherein the first hole is between the second hole and the third hole at a side of each of the second and third holes.

3. The display apparatus of claim 2, wherein a center of the second hole, a center of the first hole, and a center of the third hole are respectively at vertices of a virtual acute triangle.

4. The display apparatus of claim 2, wherein each of the first hole, the second hole, and the third hole has a circular shape, an oval shape, a rounded shape, or a polygonal shape in a plan view.

5. The display apparatus of claim 2, wherein
   the first hole is adjacent to the first rounded part, the second hole is adjacent to the second rounded part, and the third hole is adjacent to the third rounded part,
   and the inflection point and the first hole are aligned on the virtual line extending along the direction perpendicular to the second direction.

6. The display apparatus of claim 1, wherein the wiring further comprises a first portion in the first region and a second portion in the second region, the first and second portions being coupled to the bending portion.

7. The display apparatus of claim 6, wherein there are no holes in each of the first portion and the second portion.

8. The display apparatus of claim 6, wherein the first portion has a first width in the first direction, the bending portion has a second width in the first direction, and the second width is greater than the first width.

9. The display apparatus of claim 1, further comprising a first insulating layer under the bending portion, the first insulating layer comprising an organic insulating material.

10. The display apparatus of claim 2, further comprising a second insulating layer over the bending portion, the second insulating layer comprising an organic insulating material.

11. A display apparatus comprising:
    a substrate comprising a first region, a second region, and a bending region between the first region and the second region, the bending region being configured to be bent about a bending axis that extends in a first direction;
    a light-emitting device in the first region of the substrate; and
    a wiring extending in a second direction crossing the first direction, wherein the wiring comprises:
    a bending portion across the bending region;
    a first portion in the first region; and
    a second portion in the second region,
    wherein the bending portion includes a plurality of holes, the plurality of holes comprising a first column of holes arranged in the second direction and a second column of holes arranged in the second direction, wherein the first column of holes and the second column of holes are adjacent to each other, and
    wherein:
    the bending portion comprises a first side edge and a second side edge that are arranged opposite to each other with the first and second columns of holes therebetween;
    the first side edge comprises a first rounded part;
    the second side edge comprises a second rounded part, a third rounded part, and a concave part between the second rounded part and the third rounded part; and
    the concave part and a first hole selected from the first column of holes are aligned on a virtual line extending along a direction perpendicular to the second direction.

12. The display apparatus of claim 11, wherein,
    the first column of holes includes the first hole,
    the second column of holes includes a second hole and a third hole that are adjacent to each other in the second direction,
    the first hole is adjacent to the first rounded part, the second hole is adjacent to the second rounded part, and the third hole is adjacent to the third rounded part, and
    the first hole is between the second hole and the third hole at a side of each of the second and third holes.

13. The display apparatus of claim 12, wherein a center of the second hole, a center of the first hole, and a center of the third hole are respectively at vertices of a virtual acute triangle.

14. The display apparatus of claim 11, wherein each of the plurality of holes has a circular shape, an oval shape, a rounded shape, or a polygonal shape in a plan view.

15. The display apparatus of claim 11, wherein the concave part comprises an inflection point at an intersection of the second rounded part with the third rounded part, and wherein the inflection point and a point with a maximum radius of curvature of the first rounded part are aligned on the virtual line extending along the direction perpendicular to the second direction.

16. The display apparatus of claim 11, wherein there are no holes in each of the first portion and the second portion.

17. The display apparatus of claim 11, wherein the first portion has a first width in the first direction, the bending portion has a second width in the first direction, and the second width is greater than the first width.

18. The display apparatus of claim 11, further comprising a first insulating layer under the bending portion, the first insulating layer comprising an organic insulating material.

19. The display apparatus of claim 18, further comprising a second insulating layer over the bending portion, the second insulating layer comprising an organic insulating material.

\* \* \* \* \*